United States Patent
Gardner et al.

(10) Patent No.: US 11,260,657 B2
(45) Date of Patent: Mar. 1, 2022

(54) PULLDOWN DEVICES

(71) Applicant: HEWLETT-PACKARD DEVELOPMENT COMPANY, L.P., Spring, TX (US)

(72) Inventors: James Michael Gardner, Corvallis, OR (US); Scott A. Linn, Corvallis, OR (US); George H. Corrigan, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/768,066

(22) PCT Filed: Feb. 6, 2019

(86) PCT No.: PCT/US2019/016731
§ 371 (c)(1),
(2) Date: May 28, 2020

(87) PCT Pub. No.: WO2020/162892
PCT Pub. Date: Aug. 13, 2020

(65) Prior Publication Data
US 2021/0221134 A1    Jul. 22, 2021

(51) Int. Cl.
 B41J 2/04      (2006.01)
 B41J 2/14      (2006.01)
 B41J 2/045     (2006.01)
 B41J 2/175     (2006.01)

(52) U.S. Cl.
 CPC ....... *B41J 2/14072* (2013.01); *B41J 2/04511* (2013.01); *B41J 2/1753* (2013.01)

(58) Field of Classification Search
 CPC .. B41J 2/14072; B41J 2/04511; B41J 2/1753; B41J 2/04555; B41J 2/0458; B41J 2/04541; B41J 2/175; H03K 19/017581
 See application file for complete search history.

(56) References Cited

U.S. PATENT DOCUMENTS

| | | | |
|---|---|---|---|
| 5,757,394 A | 5/1998 | Gibson et al. | |
| 6,471,324 B1 | 10/2002 | Maru | |
| 7,845,747 B2 | 12/2010 | Sheahan et al. | |
| 2009/0033695 A1 | 2/2009 | Burton | |
| 2009/0244132 A1 | 10/2009 | Bruce | |
| 2012/0056954 A1 | 3/2012 | Asauchi et al. | |
| 2015/0210071 A1 | 7/2015 | Van Brocklin | |
| 2016/0067960 A1 | 3/2016 | Marchant | |

FOREIGN PATENT DOCUMENTS

| | | |
|---|---|---|
| WO | WO-2007024422 A1 | 3/2007 |
| WO | WO-2013147318 A1 | 10/2013 |

OTHER PUBLICATIONS

Allen et al., "Color Desktop Printer Technology", 4 Inkjet, 2006, pp. 111-155.

*Primary Examiner* — Lamson D Nguyen
(74) *Attorney, Agent, or Firm* — Dicke Billig & Czaja PLLC (57) ABSTRACT

An integrated circuit to drive a plurality of fluid actuation devices includes a contact pad and a programmable pulldown device. The programmable pulldown device is electrically coupled to the contact pad. The programmable pulldown device is settable to any one of a plurality of resistances.

16 Claims, 10 Drawing Sheets

PULLDOWN DEVICES

CROSS-REFERENCE TO RELATED APPLICATIONS

This application is a U.S. National Stage Application of PCT Application No. PCT/US2019/016731, filed Feb. 6, 2019, entitled "PULLDOWN DEVICES".

BACKGROUND

An inkjet printing system, as one example of a fluid ejection system, may include a printhead, an ink supply which supplies liquid ink to the printhead, and an electronic controller which controls the printhead. The printhead, as one example of a fluid ejection device, ejects drops of ink through a plurality of nozzles or orifices and toward a print medium, such as a sheet of paper, so as to print onto the print medium. In some examples, the orifices are arranged in at least one column or array such that properly sequenced ejection of ink from the orifices causes characters or other images to be printed upon the print medium as the printhead and the print medium are moved relative to each other.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

User replaceable fluid ejection devices (e.g., printheads) may include multiple exposed electrical pads that should form a reliable electrical connection to a fluid ejection system (e.g., printer) to operate correctly. These electrical pads, often referred to as dimple flex connections, may be susceptible to contamination or damage. In some cases, incorrect user handling or insertion may result in damage to electrical connections or damage to the permanent electrical interface in the fluid ejection system. The ability to verify proper electrical connectivity to each pad individually across multiple fluid ejection devices may provide an improved customer troubleshooting experience, improved safety and reliability of the fluid ejection devices, and a reduced rate of customer returns and service calls.

Accordingly, disclosed herein is a device to enable fluid ejection including pulldown devices for contact pads of the device. In one example, the pulldown devices corresponding to at least a portion of the contact pads may be enabled or disabled on a per-device basis based on signals on the contact pads. In another example, the pulldown devices corresponding to at least a portion of the contact pads may be enabled or disabled on a per-device basis based on data stored in a configuration register of the device.

Also disclosed herein is a device to enable fluid ejection including a programmable pulldown device electrically coupled to a contact pad of the device. In one example, the resistance of the programmable pulldown device may be set based on data stored in a configuration register of the device. The programmable pulldown device may be enabled or disabled based on data stored in the configuration register or signals applied to the contact pads of the fluid ejection device.

As used herein a "logic high" signal is a logic "1" or "on" signal or a signal having a voltage about equal to the logic power supplied to an integrated circuit (e.g., between about 1.8 V and 15 V, such as 5.6 V). As used herein a "logic low" signal is a logic "0" or "off" signal or a signal having a voltage about equal to a logic power ground return for the logic power supplied to the integrated circuit (e.g., about 0 V).

Figure 1:
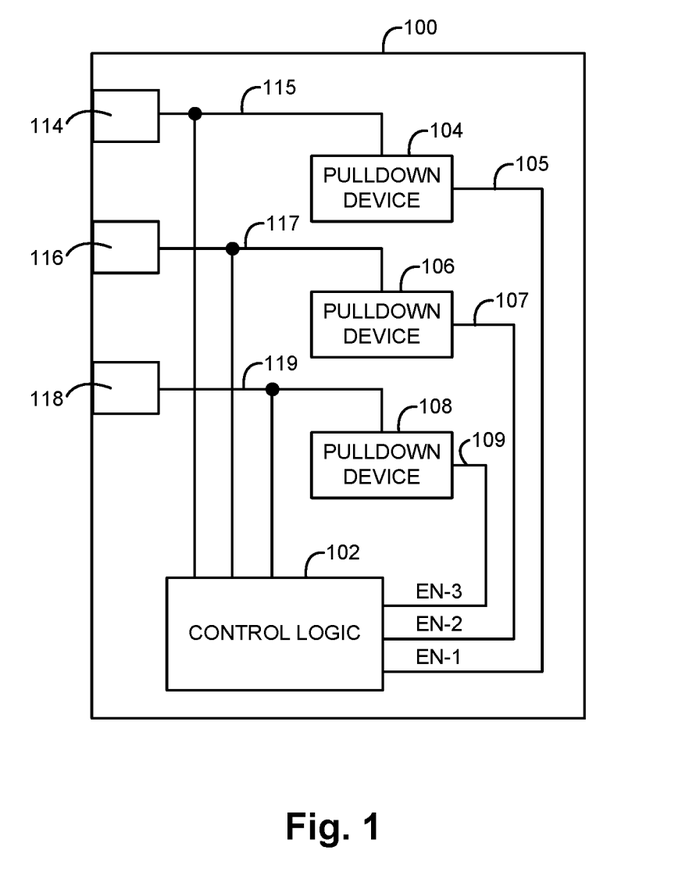
FIG. 1 is a block diagram illustrating one example of an integrated circuit to drive a plurality of fluid actuation devices.

FIG. 1 is a block diagram illustrating one example of an integrated circuit 100 to drive a plurality of fluid actuation devices. In one example, integrated circuit 100 is part of a fluid ejection die, which will be described below with reference to FIGS. 10A and 10B. Integrated circuit 100 includes control logic 102, a plurality of pulldown devices including a first pulldown device 104, a second pulldown device 106, and a third pulldown device 108, and a plurality of contact pads including a first contact pad 114, a second contact pad 116, and a third contact pad 118.

Each of the contact pads 114, 116, and 118 is electrically coupled to control logic 102 and to a corresponding pulldown device 104, 106, and 108 through a signal path 115, 117, and 119, respectively. Control logic 102 is electrically coupled to first pulldown device 104 through a first enable (EN-1) signal path 105, to second pulldown device 106 through a second enable (EN-2) signal path 107, and to third pulldown device 108 through a third enable (EN-3) signal path 109. While three pulldown devices and three corresponding contact pads are illustrated in FIG. 1, in other examples integrated circuit 100 may include less than three pulldown devices and corresponding contact pads or more than three pulldown devices and corresponding contact pads.

Control logic 102 enables at least a portion of the pulldown devices 104, 106, and 108 in response to both a logic low signal on the first contact pad 114 and a logic low signal on the second contact pad 116. In one example, control logic 102 enables at least the portion of the pulldown devices by providing a logic high enable signal on the corresponding enable signal paths 105, 107, and/or 109 in response to both a logic low signal on the first contact pad 114 and a logic low signal on the second contact pad 116. Control logic 102 may disable at least the portion of the pulldown devices in response to a logic high signal on the first contact pad 114. In one example, control logic 102 disables at least the portion of the pulldown devices by providing a logic low enable signal on the corresponding enable signal paths 105, 107, and/or 109 in response to a logic high signal on the first contact pad 114.

In one example, control logic 102 enables the pulldown device 106 corresponding to the second contact pad 116 in response to a logic low signal on the first contact pad 114 and a logic high signal on the second contact pad 116. In another example, control logic 102 enables the pulldown device 106 corresponding to the second contact pad 116 and disables the pulldown device 108 corresponding to the third contact pad 118 in response to a logic low signal on the first contact pad 114 and a logic high signal on the second contact pad 116.

Control logic 102 may include a microprocessor, an application-specific integrated circuit (ASIC), or other suitable logic circuitry for controlling the operation of integrated circuit 100. As will be described in more detail below with reference to FIGS. 2 and 3, each of the plurality of pulldown devices 104, 106, and 108 may include a transistor electrically coupled to the corresponding contact pad 114, 116, and 118 to produce a target resistance in response to the corresponding pulldown device 104, 106, and 108 being enabled.

When a pulldown device 104, 106, or 108 is enabled, the pulldown device presents a load to the electrical interface that may be measured. A measured value that is lower than expected may indicate a shorted connection, such as an ink short, while a measured value that is higher than expected may indicate an open connection. A measured value that in within an expected range indicates a proper electrical connection.

Figure 2:
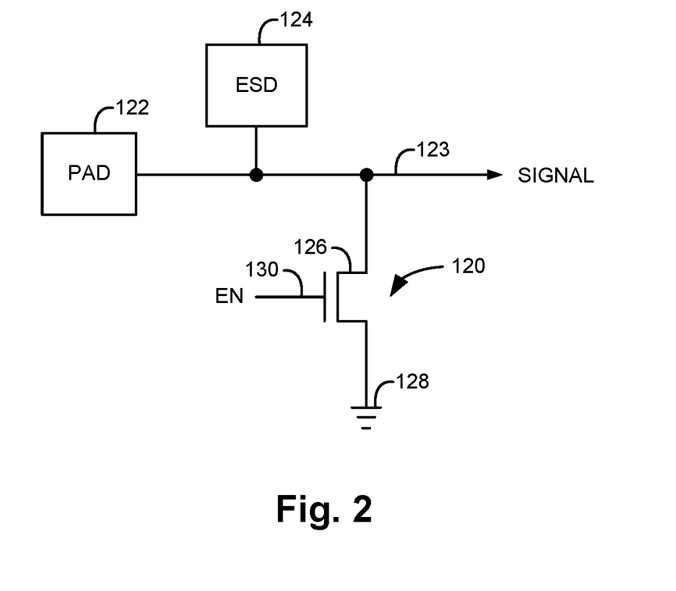
FIG. 2 is a schematic diagram illustrating one example of a pulldown device.

FIG. 2 is a schematic diagram illustrating one example of a pulldown device 120 coupled to a contact pad 122. In one example, each pulldown device 104, 106, and 108 and corresponding contact pad 114, 116, and 118 of FIG. 1 is similar to pulldown device 120 and contact pad 122. Pulldown device 120 may include a transistor 126. An electrostatic discharge circuit (ESD) 124 may also be coupled to contact pad 122. In other examples, electrostatic discharge circuit 124 may be excluded.

Contact pad 122 is electrically coupled to electrostatic discharge circuit 124 and one side of the source-drain path of transistor 126 through a signal path 123. Signal path 123 may be electrically coupled to control logic and/or other components (not shown) of the integrated circuit. The other side of the source-drain path of transistor 126 is electrically coupled to a common or ground 128. The gate of transistor 126 is electrically coupled to an enable (EN) signal path 130. In one example, each enable signal path 105, 107, and 109 of FIG. 1 is similar to enable signal path 130. Enable signal path 130 may be electrically coupled to control logic, such as control logic 102 of FIG. 1.

Electrostatic discharge circuit 124 protects internal circuitry of the integrated circuit from overvoltage conditions. In one example, transistor 126 is a field-effect transistor (FET) sized to produce a target resistance in response to an enable signal on enable signal path 130. The target resistance may be any suitable value sufficient to detect a reliable electrical connection to contact pad 122 when transistor 126 is turned on (i.e., conducting). In one example, the target resistance is between 50 kOhms and 100 kOhms, such as 75 kOhms. Since pulldown device 120 produces a target resistance when enabled, pulldown device 120 may also be referred to as a static pulldown device.

Figure 3:
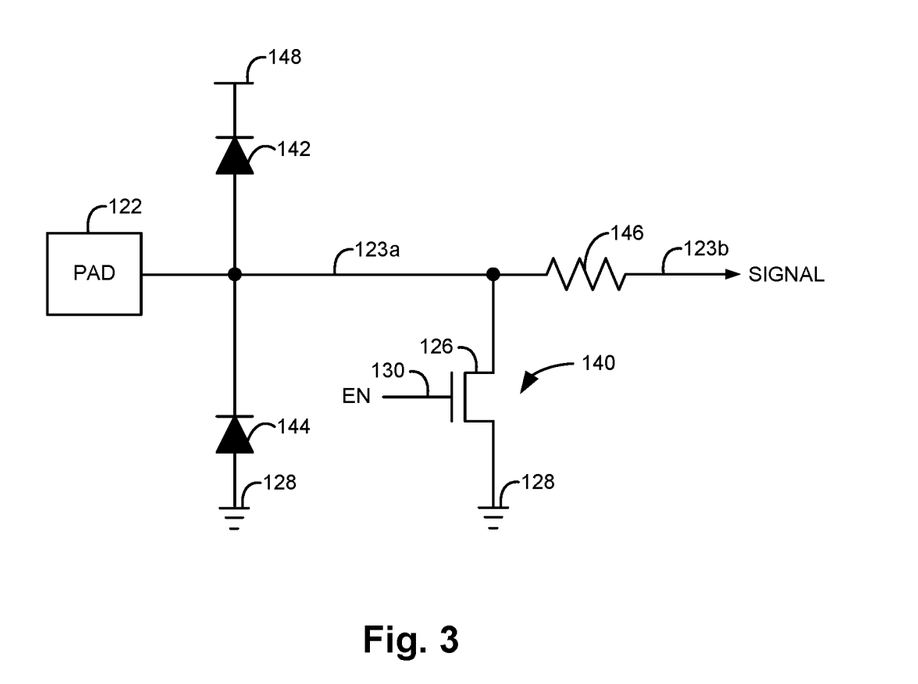
FIG. 3 is a schematic diagram illustrating another example of a pulldown device.

FIG. 3 is a schematic diagram illustrating another example of a pulldown device 140 coupled to a contact pad 122. In one example, each pulldown device 104, 106, and 108 and corresponding contact pad 114, 116, and 118 of FIG. 1 is similar to pulldown device 140 and contact pad 122. Pulldown device 140 includes a transistor 126 as previously described and illustrated with reference to FIG. 2. An electrostatic discharge circuit includes a first diode 142, a second diode 144, and a resistor 146.

Contact pad 122 is electrically coupled to the anode of diode 142, the cathode of diode 144, one side of resistor 146, and one side of the source-drain path of transistor 126 through a signal path 123a. The cathode of diode 142 is electrically coupled to a supply voltage (e.g., vdd) 148. The anode of diode 144 is electrically coupled to a common or ground 128. The other side of resistor 146 is electrically coupled to signal path 123b. Signal path 123b may be electrically coupled to control logic and/or other components (not shown) of the integrated circuit. Diodes 142 and 144 and resistor 146 prevent the buildup of static charge within the integrated circuit.

Figure 4:
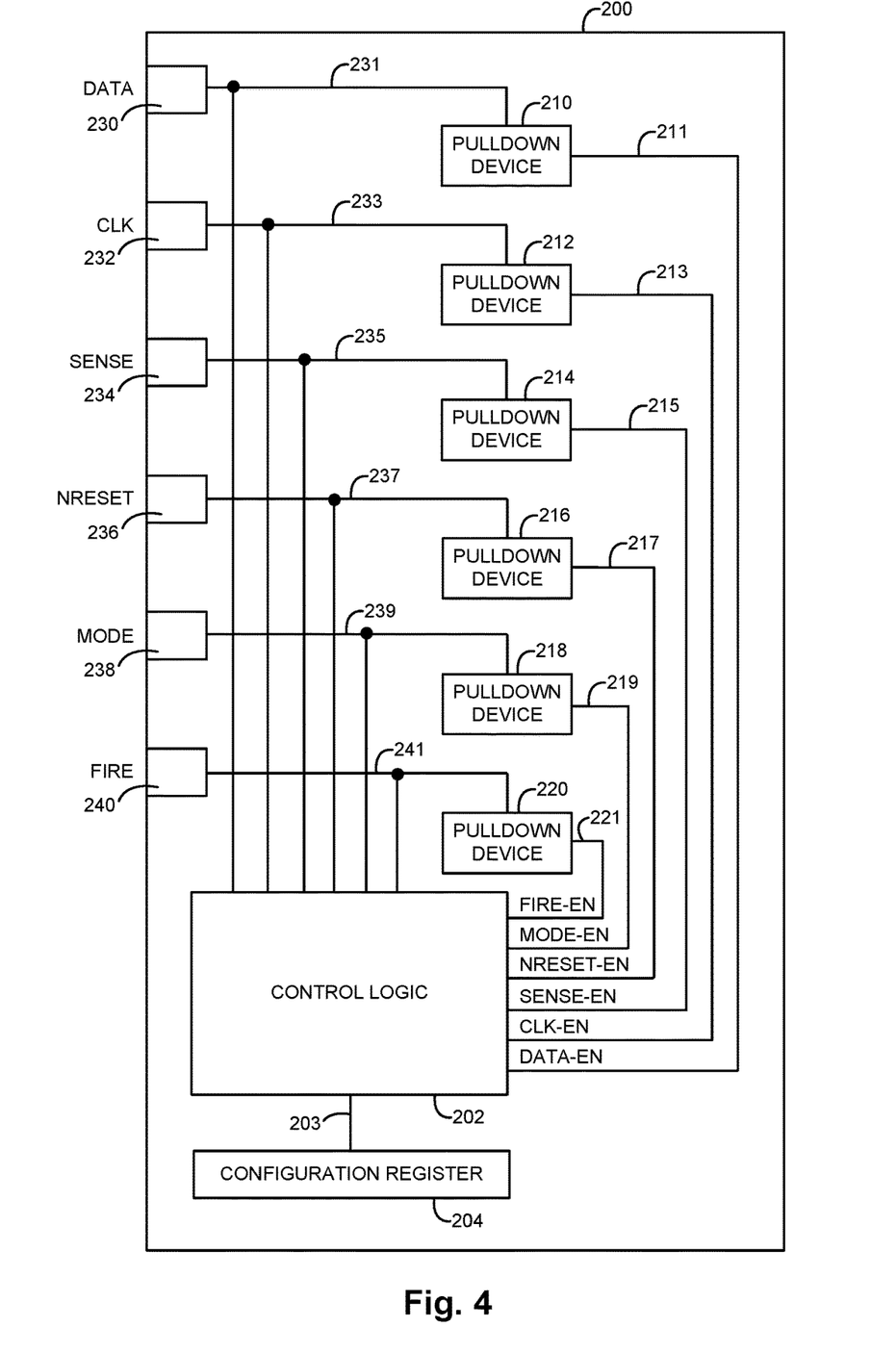
FIG. 4 is a block diagram illustrating another example of an integrated circuit to drive a plurality of fluid actuation devices.

FIG. 4 is a block diagram illustrating another example of an integrated circuit 200 to drive a plurality of fluid actuation devices. In one example, integrated circuit 200 is part of a fluid ejection die, which will be described below with reference to FIGS. 10A and 10B. Integrated circuit 200 includes control logic 202, a configuration register 204, and a plurality of pulldown devices including pulldown devices 210, 212, 214, 216, 218, and 220. In addition, integrated circuit 200 also includes a plurality of contact pads including a data (DATA) contact pad 230, a clock (CLK) contact pad 232, a multipurpose input/output (SENSE) contact pad 234, a logic reset (NRESET) contact pad 236, a mode (MODE) contact pad 238, and a fire (FIRE) contact pad 240.

Each of the contact pads 230, 232, 234, 236, 238, and 240 is electrically coupled to control logic 202 and to a corresponding pulldown device 210, 212, 214, 216, 218, and 220 through a signal path 231, 233, 235, 237, 239, and 241, respectively. Control logic 202 is electrically coupled to configuration register 204 through a signal path 203. In addition, control logic 202 is electrically coupled to pulldown device 210 through an enable (DATA-EN) signal path 211, pulldown device 212 through an enable (CLK-EN) signal path 213, pulldown device 214 through an enable (SENSE-EN) signal path 215, pulldown device 216 through an enable (NRESET-EN) signal path 217, pulldown device 218 through an enable (MODE-EN) signal path 219, and pulldown device 220 through an enable (FIRE-EN) signal path 221. While six pulldown devices and six corresponding contact pads are illustrated in FIG. 4, in other examples integrated circuit 200 may include less than six pulldown devices and corresponding contact pads or more than six pulldown devices and corresponding contact pads.

In one example, control logic 202 may enable each of the pulldown devices 210, 212, 214, 216, 218, and 220 in response to both a logic low signal on the logic reset contact pad 236 and a logic low signal on the data contact pad 230. In one example, the logic reset contact pad may be an active-low reset contact pad. Control logic 202 may disable each of the pulldown devices other than the pulldown device 216 corresponding to the logic reset contact pad 236 in response to a logic high signal on the logic reset contact pad 236. In one example, control logic 202 may enable the pulldown device 210 corresponding to the data contact pad 230 in response to a logic low signal on the logic reset contact pad 236 and a logic high signal on the data contact pad 230. Control logic 202 may disable the pulldown devices 212, 214, and 218 corresponding to the clock contact pad 232, the multipurpose input/output contact pad 234, and the mode contact pad 238 in response to the logic low signal on the logic reset contact pad 236 and the logic high signal on the data contact pad 230. In one example, pulldown devices 216 and 220 corresponding to the logic reset contact pad 236 and the fire contact pad 240 may be disabled based on data stored in the configuration register 204.

Control logic 202 may include a microprocessor, an ASIC, or other suitable logic circuitry for controlling the operation of integrated circuit 200. Configuration register 204 may be a memory device (e.g., nonvolatile memory, shift register, etc.) and may include any suitable number of bits (e.g., 4 bits to 24 bits, such as 12 bits). As previously described and illustrated with reference to FIGS. 2 and 3, each of the plurality of pulldown devices 210, 212, 214, 216, 218, and 220 may include a transistor electrically coupled to the corresponding contact pad 230, 232, 234, 236, 238, and 240, respectively, to produce a target resistance in response to the corresponding pulldown device being enabled.

Figure 5A:
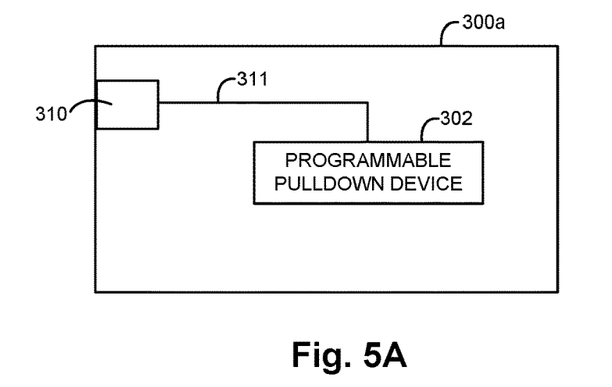
FIGS. 5A-5C are block diagrams illustrating other examples of integrated circuits to drive a plurality of fluid actuation devices.

FIG. 5A is a block diagram illustrating one example of an integrated circuit 300a to drive a plurality of fluid actuation devices. In one example, integrated circuit 300a is part of a fluid ejection die, which will be described below with reference to FIGS. 10A and 10B. Integrated circuit 300a includes a programmable pulldown device 302 and a contact pad 310. Programmable pulldown device 302 is electrically coupled to the contact pad 310 through a signal path 311. As will be described in more detail below with reference to FIGS. 6 and 7, the programmable pulldown device 302 may be set to any one of a plurality of resistances. In one example, programmable pulldown device 302 may replace each static pulldown device previously described and illustrated with reference to FIGS. 1-4.

Programmable pulldown device 302 may be used to further improve the detection capability of contact pad interconnect status compared to the static pulldown devices previously described. For example, programmable pulldown device 302 may be used to improve the sensitivity of ink shorts detection and provide a fabrication process specific load profile that may be cross referenced for identifying genuine devices (as opposed to counterfeit devices). When enabled, programmable pulldown device 302 presents a load to the electrical interface that may be measured. By forcing a known voltage or current onto the contact pad 310 (externally), and changing the pulldown voltage bias value (internally), expected changes in contact pad resistance may be observed for devices operating correctly (i.e., pad leakage is below an acceptable threshold). Deviations from the expected response may indicate a malfunction.

Figure 5B:
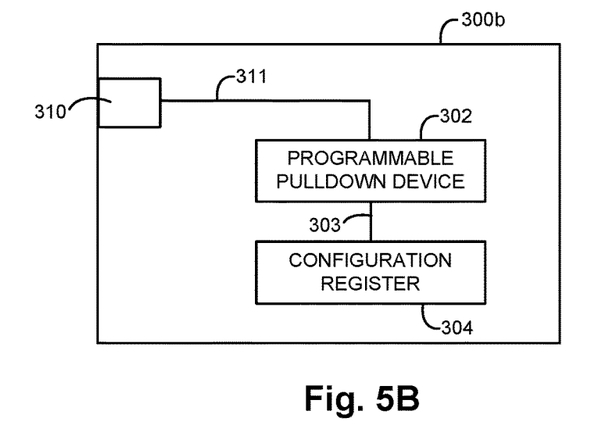

FIG. 5B is a block diagram illustrating another example of an integrated circuit 300b to drive a plurality of fluid actuation devices. In one example, integrated circuit 300b is part of a fluid ejection die, which will be described below with reference to FIGS. 10A and 10B. Integrated circuit 300b includes a programmable pulldown device 302, a configuration register 304, and a contact pad 310. Programmable pulldown device 302 is electrically coupled to the contact pad 310 through a signal path 311 and to the configuration register 304 through a signal path 303. In this example, the resistance of the programmable pulldown device 302 may be set based on data stored in the configuration register. In one example, programmable pulldown device 302 may also be enabled or disabled based on data stored in the configuration register.

Figure 5C:
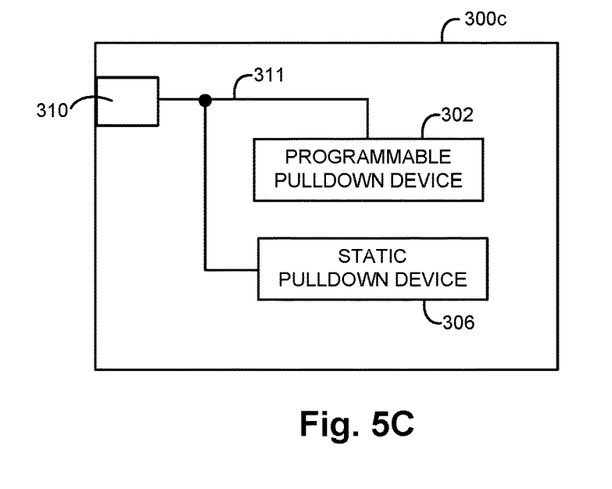

FIG. 5C is a block diagram illustrating another example of an integrated circuit 300c to drive a plurality of fluid actuation devices. In one example, integrated circuit 300c is part of a fluid ejection die, which will be described below with reference to FIGS. 10A and 10B. Integrated circuit 300c includes a programmable pulldown device 302, a static pulldown device 306, and a contact pad 310. Contact pad 310 is electrically coupled to programmable pulldown device 302 and static pulldown device 306 through a signal path 311. In one example, static pulldown device 306 is similar to pulldown device 120 or 140 previously described and illustrated with reference to FIGS. 2 and 3, respectively.

Programmable pulldown device 302 and static pulldown device 306 may be enabled or disabled by control logic (not shown) and/or based on data stored in a configuration register (e.g., configuration register 304 of FIG. 5B). In one example, programmable pulldown device 302 and static pulldown device 306 may both be disabled. In another example, programmable pulldown device 302 may be enabled and static pulldown device 306 may be disabled. In another example, programmable pulldown device 302 may be disabled and static pulldown device 306 may be enabled. In another example, programmable pulldown device 302 and static pulldown device 306 may both be enabled.

Figure 6:
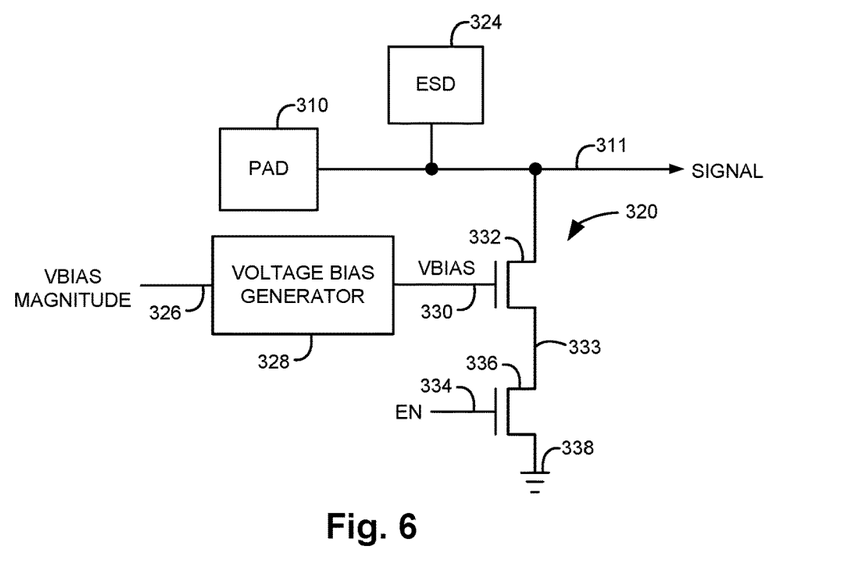
FIG. 6 is a schematic diagram illustrating one example of a programmable pulldown device.

FIG. 6 is a schematic diagram illustrating one example of a programmable pulldown device 320 coupled to a contact pad 310. In one example, each programmable pulldown device 302 of FIGS. 5A-5C is similar to programmable pulldown device 320. Programmable pulldown device 320 includes a voltage bias generator 328, a first transistor 332, and a second transistor 336. An electrostatic discharge circuit (ESD) 324 may also be coupled to contact pad 310. In other examples, electrostatic discharge circuit 324 may be excluded.

Contact pad 310 is electrically coupled to electrostatic discharge circuit 324 and one side of the source-drain path of first transistor 332 through a signal path 311. Signal path 311 may be electrically coupled to control logic and/or other components (not shown) of the integrated circuit. The other side of the source-drain path of first transistor 332 is electrically coupled to one side of the source-drain path of second transistor 336 through a signal path 333. The other side of the source-drain path of second transistor 336 is electrically coupled to a common or ground 338. The gate of second transistor 336 is electrically coupled to an enable (EN) signal path 334. An input of voltage bias generator 328 receives a voltage bias (VBIAS) magnitude signal on a signal path 326. An output of voltage bias generator 328 is electrically coupled to the gate of the first transistor 332 through a voltage bias (VBIAS) signal path 330.

Electrostatic discharge circuit 324 protects internal circuitry of the integrated circuit from overvoltage conditions. Voltage bias generator 328 provides a bias voltage to the gate of first transistor 332 in response to the bias magnitude on signal path 326. In one example, the bias magnitude may be stored in configuration register 304 (FIG. 5B) or be set by control logic. In one example, the bias magnitude may include a multi-bit value (e.g., 5 bit value) such that programmable pulldown device 320 is settable to any one of 32 different resistance values. In other examples, the bias magnitude may include values having another number of bits, such as a four bit or six bit value.

The bias voltage sets the programmable pulldown device 320 to one of a plurality of resistances by setting the resistance of first transistor 332 in response to the bias voltage. In one example, the first transistor 332 produces a resistance between 30 kOhms and 300 kOhms based on the bias voltage. Second transistor 336 enables or disables the programmable pulldown device 320 in response to an enable signal on enable signal path 334. Enable signal path 334 may be electrically coupled to control logic and/or to a configuration register. In one example, programmable pulldown device 320 is enabled based on data stored in a configuration register 304 (FIG. 5B). For example, a logic high enable signal may be provided on enable signal path 334 to turn on second transistor 336 in response to a logic high programmable pulldown device enable bit stored in the configuration register. A logic low enable signal may be provided on enable signal path 334 to turn off second transistor 336 in response to a logic low programmable pulldown device enable bit stored in the configuration register.

Figure 7:
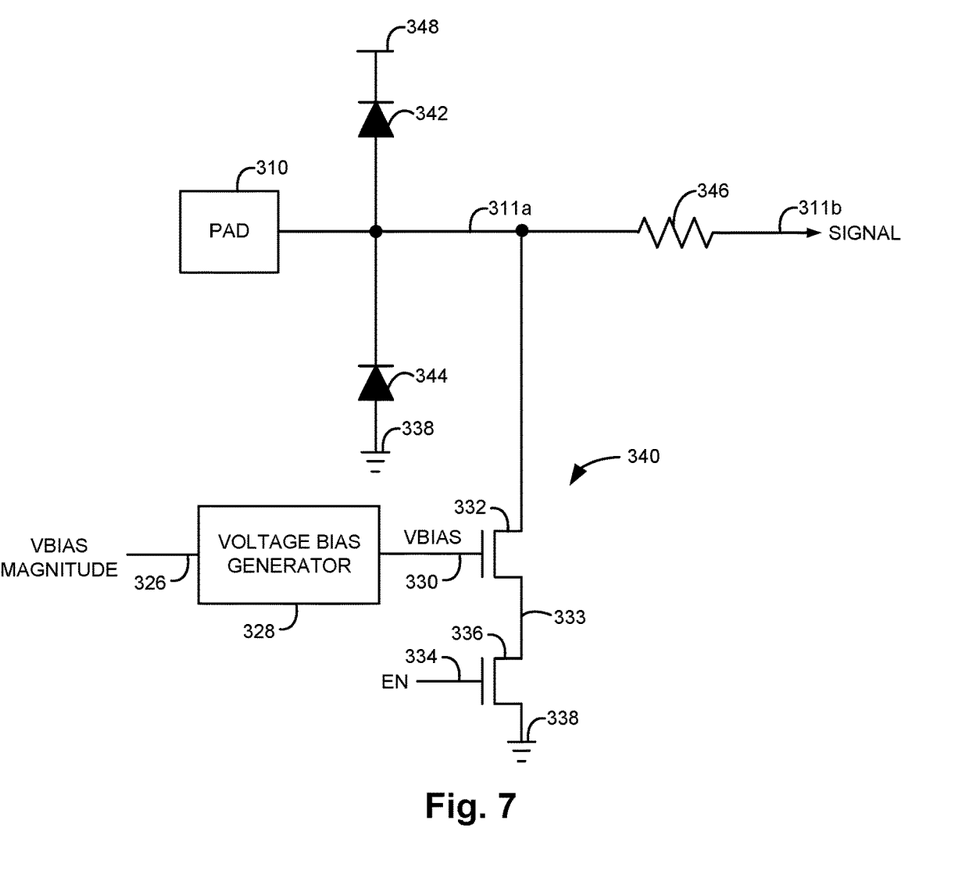
FIG. 7 is a schematic diagram illustrating another example of a programmable pulldown device.

FIG. 7 is a schematic diagram illustrating another example of a programmable pulldown device 340 coupled to a contact pad 310. In one example, each programmable pulldown device 302 of FIGS. 5A-5C is similar to programmable pulldown device 340. Programmable pulldown device 340 includes a voltage bias generator 328, a first transistor 332, and a second transistor 336 as previously described and illustrated with reference to FIG. 6. In addition, an electrostatic discharge circuit includes a first diode 342, a second diode 344, and a resistor 346.

Contact pad 310 is electrically coupled to the anode of diode 342, the cathode of diode 344, one side of resistor 346, and one side of the source-drain path of first transistor 332 through a signal path 311a. The cathode of diode 342 is electrically coupled to a supply voltage (e.g., vdd) 348. The anode of diode 344 is electrically coupled to a common or ground 338. The other side of resistor 346 is electrically coupled to a signal path 311b. Signal path 311b may be electrically coupled to control logic and/or other components (not shown) of the integrated circuit. Diodes 342 and 344 and resistor 346 prevent the buildup of static charge within the integrated circuit.

Figure 8:
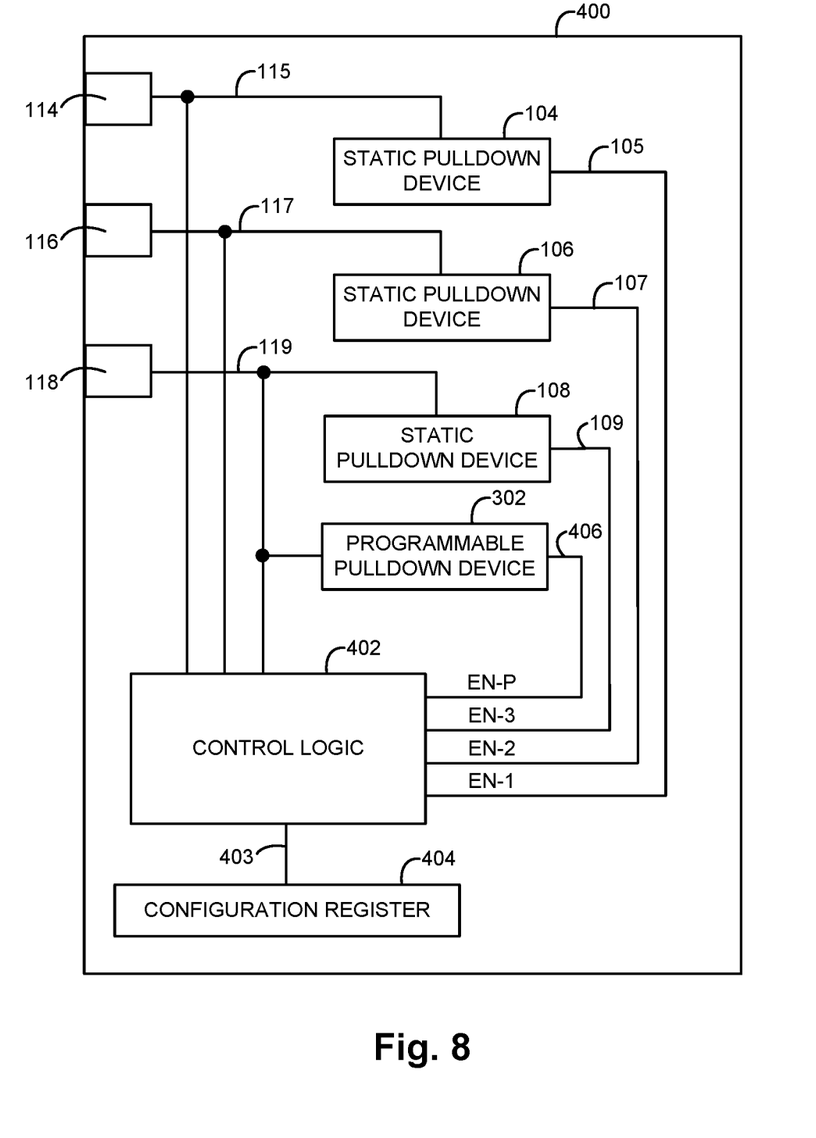
FIG. 8 is a block diagram illustrating another example of an integrated circuit to drive a plurality of fluid actuation devices.

FIG. 8 is a block diagram illustrating another example of an integrated circuit 400 to drive a plurality of fluid actuation devices. In one example, integrated circuit 400 is part of a fluid ejection die, which will be described below with reference to FIGS. 10A and 10B. Integrated circuit 400 includes components of integrated circuit 100 previously described and illustrated with reference to FIG. 1, including static pulldown devices 104, 106, and 108, and contact pads 114, 116, and 118. In addition, integrated circuit 400 includes a programmable pulldown device 302 as previously described and illustrated with reference to FIG. 5A, control logic 402, and a configuration register 404.

Each of the contact pads 114, 116, and 118 is electrically coupled to control logic 402 and a corresponding static pulldown device 104, 106, and 108 through a signal path 115, 117, and 119, respectively. The programmable pulldown device 302 is also electrically coupled to the third contact pad 118 through signal path 119. Control logic 402 is electrically coupled to configuration register 404 through a signal path 403. Control logic 402 is electrically coupled to static pulldown device 104 through a first enable (EN-1) signal path 105, to static pulldown device 106 through a second enable (EN-2) signal path 107, to static pulldown device 108 through a third enable (EN-3) signal path 109, and to programmable pulldown device 302 via a programmable pulldown device enable (EN-P) signal path 406. While three static pulldown devices and three corresponding contact pads are illustrated in FIG. 8, in other examples integrated circuit 400 may include less than three static pulldown devices and corresponding contact pads or more than three pulldown devices and corresponding contact pads. Likewise, while one programmable pulldown device is illustrated in FIG. 8, in other examples integrated circuit 400 may include more than one programmable pulldown device corresponding to more than one contact pad.

Control logic 402 may include a microprocessor, an ASIC, or other suitable logic circuitry for controlling the operation of integrated circuit 400. Configuration register 404 may be a memory device (e.g., nonvolatile memory, shift register, etc.) and may include any suitable number of bits (e.g., 4 bits to 24 bits, such as 12 bits). As previously described above, each static pulldown device 104, 106, and 108 may be enabled or disabled by control logic 402 based on signals on first contact pad 114 and second contact pad 116 and/or based on data stored in configuration register 404. In addition, in one example, programmable pulldown device 302 may be enabled or disabled and the resistance of programmable pulldown device 302 may be set based on data stored in configuration register 404.

In another example, programmable pulldown device 302 may be enabled in response to both a logic low signal on the first contact pad 114 and a logic low signal on the second contact pad 116. In yet another example, programmable pulldown device 302 may be electrically coupled to first contact pad 114 instead of to third contact pad 118. In this case, control logic 402 may enable the programmable pulldown device 302 in response to both a logic low signal on the second contact pad 116 and a logic low signal on the third contact pad 118.

Figure 9:
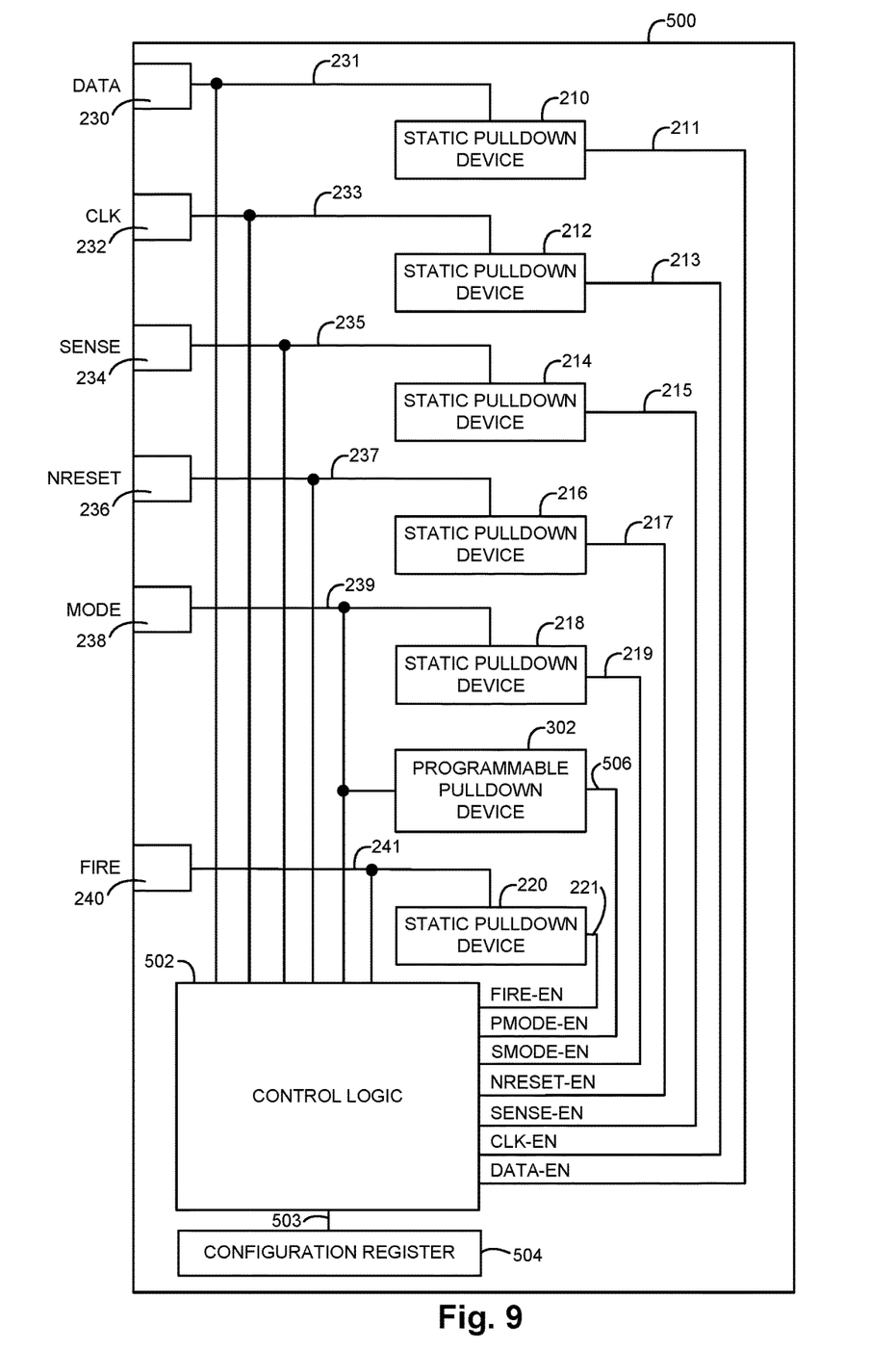
FIG. 9 is a block diagram illustrating another example of an integrated circuit to drive a plurality of fluid actuation devices.

FIG. 9 is a block diagram illustrating another example of an integrated circuit 500 to drive a plurality of fluid actuation devices. In one example, integrated circuit 500 is part of a fluid ejection die, which will be described below with reference to FIGS. 10A and 10B. Integrated circuit 500 includes components of integrated circuit 200 previously described and illustrated with reference to FIG. 4, including static pulldown devices 210, 212, 214, 216, 218, and 220, and contact pads 230, 232, 234, 236, 238, and 240. In addition, integrated circuit 500 includes a programmable pulldown device 302 as previously described and illustrated with reference to FIG. 5A, control logic 502, and a configuration register 504.

Each of the contact pads 230, 232, 234, 236, 238, and 240 is electrically coupled to control logic 502 and to a corresponding static pulldown device 210, 212, 214, 216, 218, and 220 through a signal path 231, 233, 235, 237, 239, and 241, respectively. The programmable pulldown deice 302 is also electrically coupled to the mode contact pad 238 through signal path 239. Control logic 502 is electrically coupled to configuration register 504 through a signal path 503. Control logic 502 is electrically coupled to static pulldown device 210 through an enable (DATA-EN) signal path 211, static pulldown device 212 through an enable (CLK-EN) signal path 213, static pulldown device 214 through an enable (SENSE-EN) signal path 215, static pulldown device 216 through an enable (NRESET-EN) signal path 217, static pulldown device 218 through an enable (MODE-EN) signal path 219, and static pulldown device 220 through an enable (FIRE-EN) signal path 221. Control logic 502 is electrically coupled to programmable pulldown device 302 through an enable (PMODE-EN) signal path 506. While six static pulldown devices and six corresponding contact pads are illustrated in FIG. 9, in other examples integrated circuit 500 may include less than six static pulldown devices and corresponding contact pads or more than six static pulldown devices and corresponding contact pads. Likewise, while one programmable pulldown device is illustrated in FIG. 9 coupled to the mode contact pad 238, in other examples the programmable pulldown device may be coupled to a different contact pad and/or integrated circuit 500 may include more than one programmable pulldown device corresponding to more than one contact pad.

Control logic 502 may include a microprocessor, an ASIC, or other suitable logic circuitry for controlling the operation of integrated circuit 500. Configuration register 504 may be a memory device (e.g., nonvolatile memory, shift register, etc.) and may include any suitable number of bits (e.g., 4 bits to 24 bits, such as 12 bits). As previously described, each of the static pulldown devices 210, 212, 214, 216, 218, and 220 may be enabled or disabled by control logic 502 based on signals on the logic reset contact pad 236 and the data contact pad 230 or based on data stored in configuration register 504. In one example, static pulldown devices 216 and 220 corresponding to the logic reset contact pad 236 and the fire contact pad 240 may be enabled or disabled based on data stored in the configuration register 504. In addition, programmable pulldown device 302 may be enabled or disabled and the resistance of programmable pulldown device 302 may be set based on data stored in configuration register 504.

The following table summarizes one example for when each of the pulldown devices of FIG. 9 is enabled or disabled. In addition, the programmable pulldown device of the MODE contact pad and the static pulldown devices of the NRESET and FIRE contact pads may be enabled and disabled via the configuration register. In one example, the programmable pulldown device of the MODE contact pad defaults to disabled and the static pulldown devices of the NRESET and FIRE contact pads default to enabled as shown in the following table.

TABLE

Enabling and Disabling of Contact Pad Pulldown Devices

| Pad Name | Pulldown Resistance | NRESET = 0 && DATA = 0 | NRESET = 0 && DATA = 1 | NRESET = 1 && DATA = X |
| --- | --- | --- | --- | --- |
| DATA | Static | Enabled | Enabled | Disabled |
| CLK | Static | Enabled | Disabled | Disabled |
| SENSE | Static | Enabled | Disabled | Disabled |
| NRESET | Static | Enabled | Enabled | Enabled |
| MODE | Static | Enabled | Disabled | Disabled |
| MODE | Programmable | Disabled | Disabled | Disabled |
| FIRE | Static | Enabled | Enabled | Enabled |

Figure 10A:
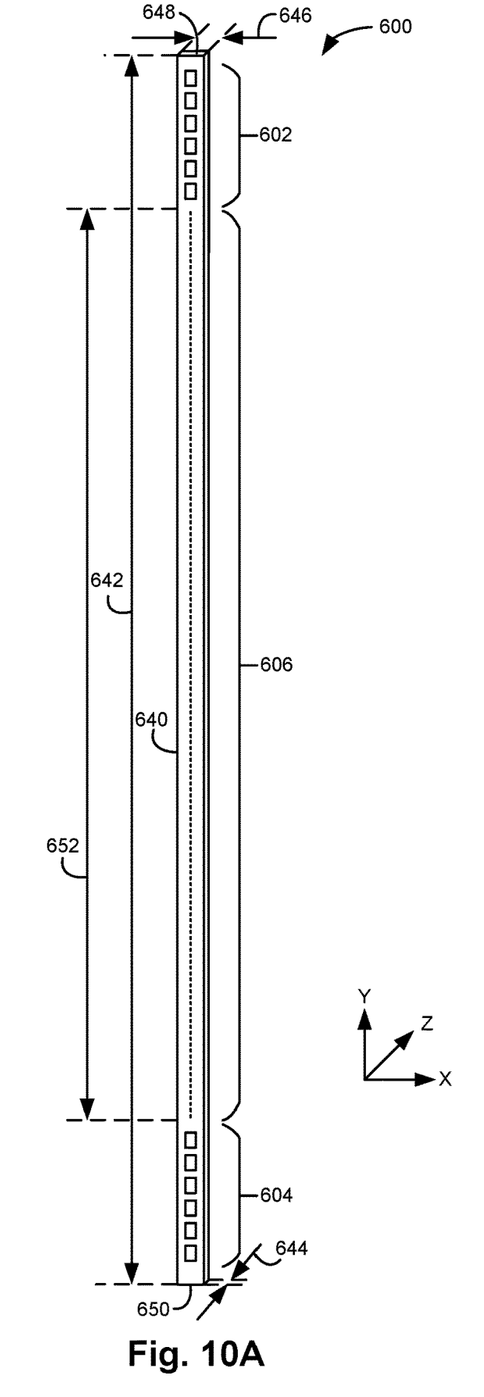
FIGS. 10A and 10B illustrate one example of a fluid ejection die.
Figure 10B:
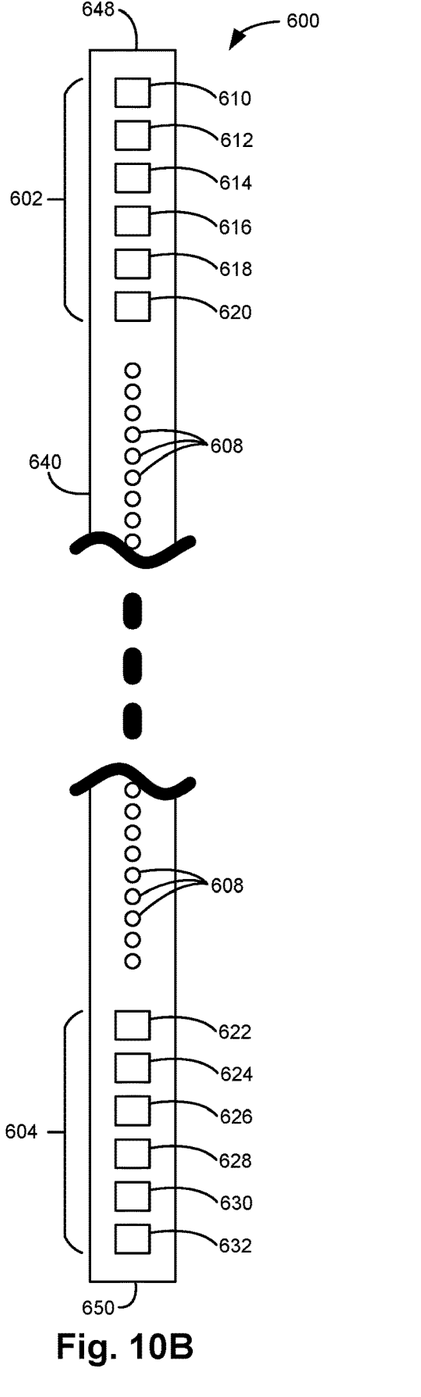

FIG. 10A illustrates one example of a fluid ejection die 600 and FIG. 10B illustrates an enlarged view of the ends of fluid ejection die 600. Die 600 includes a first column 602 of contact pads, a second column 604 of contact pads, and a column 606 of fluid actuation devices 608. The second column 604 of contact pads is aligned with the first column 602 of contact pads and at a distance (i.e., along the Y axis) from the first column 602 of contact pads. The column 606 of fluid actuation devices 608 is disposed longitudinally to the first column 602 of contact pads and the second column 604 of contact pads. The column 606 of fluid actuation devices 608 is also arranged between the first column 602 of contact pads and the second column 604 of contact pads. In one example, fluid actuation devices 608 are nozzles or fluidic pumps to eject fluid drops.

In one example, the first column 602 of contact pads includes six contact pads. The first column 602 of contact pads may include the following contact pads in order: a data contact pad 610, a clock contact pad 612, a logic power ground return contact pad 614, a multipurpose input/output contact pad 616, a first high voltage power supply contact pad 618, and a first high voltage power ground return contact pad 620. Therefore, the first column 602 of contact pads includes the data contact pad 610 at the top of the first column 602, the first high voltage power ground return contact pad 620 at the bottom of the first column 602, and the first high voltage power supply contact pad 618 directly above the first high voltage power ground return contact pad 620. While contact pads 610, 612, 614, 616, 618, and 620 are illustrated in a particular order, in other examples the contact pads may be arranged in a different order.

In one example, the second column 604 of contact pads includes six contact pads. The second column 604 of contact pads may include the following contact pads in order: a second high voltage power ground return contact pad 622, a second high voltage power supply contact pad 624, a logic reset contact pad 626, a logic power supply contact pad 628, a mode contact pad 630, and a fire contact pad 632. Therefore, the second column 604 of contact pads includes the second high voltage power ground return contact pad 622 at the top of the second column 604, the second high voltage power supply contact pad 624 directly below the second high voltage power ground return contact pad 622, and the fire contact pad 632 at the bottom of the second column 604. While contact pads 622, 624, 626, 628, 630, and 632 are illustrated in a particular order, in other examples the contact pads may be arranged in a different order.

In one example, data contact pad 610 may provide DATA contact pad 230 of FIG. 4 or 9. Clock contact pad 612 may provide CLK contact pad 232 of FIG. 4 or 9. Multipurpose input/output contact pad 616 may provide SENSE contact pad 234 of FIG. 4 or 9. Logic reset contact pad 626 may provide NRESET contact pad 236 of FIG. 4 or 9. Mode contact pad 630 may provide MODE contact pad 238 of FIG. 4 or 9. Fire contact pad 632 may provide FIRE contact pad 240 of FIG. 4 or 9.

Data contact pad 610 may be used to input serial data to die 600 for selecting fluid actuation devices, memory bits, thermal sensors, configuration modes (e.g. via a configuration register 204 or 504 of FIGS. 4 and 9, respectively), etc. Data contact pad 610 may also be used to output serial data from die 600 for reading memory bits, configuration modes, status information, etc. Clock contact pad 612 may be used to input a clock signal to die 600 to shift serial data on data contact pad 610 into the die or to shift serial data out of the die to data contact pad 610. Logic power ground return contact pad 614 provides a ground return path for logic power (e.g., about 0 V) supplied to die 600. In one example, logic power ground return contact pad 614 is electrically coupled to the semiconductor (e.g., silicon) substrate 640 of die 600. Multipurpose input/output contact pad 616 may be used for analog sensing and/or digital test modes of die 600.

First high voltage power supply contact pad 618 and second high voltage power supply contact pad 624 may be used to supply high voltage (e.g., about 32 V) to die 600. First high voltage power ground return contact pad 620 and second high voltage power ground return contact pad 622 may be used to provide a power ground return (e.g., about 0 V) for the high voltage power supply. The high voltage power ground return contact pads 620 and 622 are not directly electrically connected to the semiconductor substrate 640 of die 600. The specific contact pad order with the high voltage power supply contact pads 618 and 624 and the high voltage power ground return contact pads 620 and 622 as the innermost contact pads may improve power delivery to die 600. Having the high voltage power ground return contact pads 620 and 622 at the bottom of the first column 602 and at the top of the second column 604, respectively, may improve reliability for manufacturing and may improve ink shorts protection.

Logic reset contact pad 626 may be used as a logic reset input to control the operating state of die 600. Logic power supply contact pad 628 may be used to supply logic power (e.g., between about 1.8 V and 15 V, such as 5.6 V) to die 600. Mode contact pad 630 may be used as a logic input to control access to enable/disable configuration modes (i.e., functional modes) of die 600. Fire contact pad 632 may be used as a logic input to latch loaded data from data contact pad 610 and to enable fluid actuation devices or memory elements of die 600.

Die 600 includes an elongate substrate 640 having a length 642 (along the Y axis), a thickness 644 (along the Z axis), and a width 646 (along the X axis). In one example, the length 642 is at least twenty times the width 646. The width 646 may be 1 mm or less and the thickness 644 may be less than 500 microns. The fluid actuation devices 608 (e.g., fluid actuation logic) and contact pads 610-632 are provided on the elongate substrate 640 and are arranged along the length 642 of the elongate substrate. Fluid actuation devices 608 have a swath length 652 less than the length 642 of the elongate substrate 640. In one example, the swath length 652 is at least 1.2 cm. The contact pads 610-632 may be electrically coupled to the fluid actuation logic. The first column 602 of contact pads may be arranged near a first longitudinal end 648 of the elongate substrate 640. The second column 604 of contact pads may be arranged near a second longitudinal end 650 of the elongate substrate 640 opposite to the first longitudinal end 648.

Figure 11:
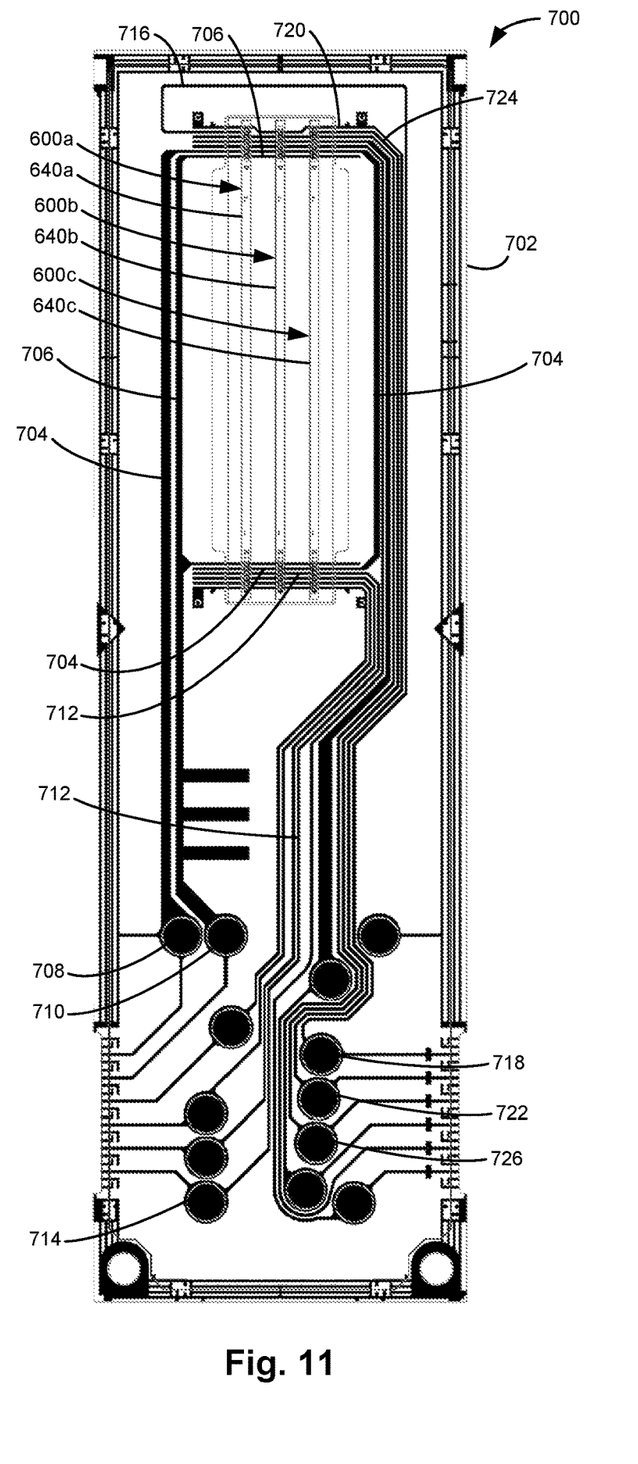
FIG. 11 illustrates one example of a fluid ejection device.

FIG. 11 illustrates one example of a fluid ejection device 700. In one example, fluid ejection device 700 is a printhead assembly for ejecting fluid of three different colors (e.g., cyan, magenta, and yellow). Fluid ejection device 700 includes a carrier 702 and a plurality of fluid ejection dies 600a-600c. As previously described and illustrated with reference to FIGS. 10A and 10B, each fluid ejection die 600a-600c includes an elongate substrate 640a-640c, respectively. The plurality of elongate substrates 640a-640c are arranged parallel to each other on the carrier 702. Each of the plurality of elongate substrates 640a-640c may include a single color substrate and each single color substrate may be of a different color. Elongate substrates 640a-640c may be embedded in or adhered to carrier 702. Carrier 702 may be a rigid carrier including an epoxy or another suitable material.

Carrier 702 includes electrical routing (e.g. conductive lines 704, 706, 712, 716, 720, and 724 described below) to electrical interconnect pads (e.g., electrical interconnect pads 708, 710, 714, 718, 722, and 726 described below) to connect a fluid ejection system circuit (e.g., a printer circuit) to the contact pads of the elongate substrates 640a-640c. In one example, the electrical routing may be arranged between the elongate substrates 640a-640c.

The plurality of fluid ejection devices includes a first fluid ejection die 600a, a second fluid ejection die 600b, and a third fluid ejection die 600c. The first fluid ejection die 600a includes a first plurality of contact pads including a first contact pad (e.g., a logic reset contact pad 626) and a second contact pad (e.g., a data contact pad 610), a first plurality of pulldown devices (not shown) as previously described, and first control logic (not shown) as previously described. Each of the first plurality of pulldown devices is electrically coupled to a corresponding contact pad of the first plurality of contact pads. The first control logic enables at least a portion of the pulldown devices of the first plurality of pulldown devices in response to both a logic low signal on the first contact pad (e.g., the logic reset contact pad 626) and a logic low signal on the second contact pad (e.g., the data contact pad 610).

The second fluid ejection die 600b includes a second plurality of contact pads comprising a third contact pad (e.g., a logic reset contact pad 626) and a fourth contact pad (e.g., a data contact pad 610), a second plurality of pulldown devices (not shown) as previously described, and second control logic (not shown) as previously described. Each of the second plurality of pulldown devices is electrically coupled to a corresponding contact pad of the second plurality of contact pads. The second control logic enables at least a portion of the pulldown devices of the second plurality of pulldown devices in response to both a logic low signal on the third contact pad (e.g., the logic reset contact pad 626) and a logic low signal on the fourth contact pad (e.g., the data contact pad 610).

A conductive line 712 electrically couples the first contact pad (e.g., the logic reset contact pad 626 of the first fluid ejection die 600a) to the third contact pad (e.g., the logic reset contact pad 626 of the second fluid ejection die 600b). In one example, conductive line 712 is also electrically coupled to a contact pad (e.g., the logic reset contact pad 626) of the third fluid ejection die 600c. The second contact pad (e.g., the data contact pad 610 of the first fluid ejection die 600a) is electrically isolated from the fourth contact pad (e.g., the data contact pad 610 of the second fluid ejection die 600b). In one example, a contact pad (e.g., the data contact pad 610) of the third fluid ejection die 600c is also electrically isolated from the second contact pad (e.g., the data contact pad 610 of the first fluid ejection die 600a) and the fourth contact pad (e.g., the data contact pad 610 of the second fluid ejection die 600b).

Conductive line 712 may electrically couple the logic reset contact pad 626 of each of the plurality of fluid ejection dies 600a-600c to an electrical interconnect pad 714. A conductive line 716 may electrically couple the data contact pad 610 of the first fluid ejection die 600a to an electrical interconnect pad 718. A conductive line 720 may electrically couple the data contact pad 610 of the second fluid ejection die 600b to an electrical interconnect pad 722. Likewise, a conductive line 724 may electrically couple the data contact pad 610 of the third fluid ejection die 600c to an electrical interconnect pad 726. Since each data contact pad of the plurality of fluid ejection dies 600a-600c is electrically isolated from the other data contact pads of the plurality of fluid ejection dies 600a-600c, signals applied to the data contact pads may be used to individually enable or disable the pulldown devices of each of the plurality of fluid ejection dies 600a-600c. In this way, the electrical connections to each fluid ejection die 600a-600c may be individually tested.

Carrier 702 may include a conductive line 704 electrically coupling a first contact pad of each elongate substrate 640a-640c (e.g., the first high voltage power supply contact pad 618 of each elongate substrate 640a-640c) to a second contact pad of each elongate substrate 640a-640c (e.g., the second high voltage power supply contact pad 624 of each elongate substrate 640a-640c). Carrier 702 may also include a conductive line 706 electrically coupling a first contact pad of each elongate substrate 640a-640c (e.g., first high voltage power ground return contact pad 620 of each elongate substrate 640a-640c) to a second contact pad of each elongate substrate 640a-640c (e.g., second high voltage power ground return contact pad 622 of each elongate substrate 640a-640c).

The conductive line 704 may be electrically coupled to an electrical interconnect pad 708, and the conductive line 706 may be electrically coupled to an electrical interconnect pad 710. The electrical interconnect pads 708 and 710 may be used to supply high voltage power from a fluid ejection system to elongate substrates 640a-640c. Additional conductive lines and additional electrical interconnect pads may be electrically coupled to the other contact pads of elongate substrates 640a-640c to provide electrical connections between elongate substrates 640a-640c and a fluid ejection system. The orientation of the contact pads of elongate substrates 640a-640c enables the multiple dies to be bonded in parallel with fewer flex wires and connections.

Figure 12:
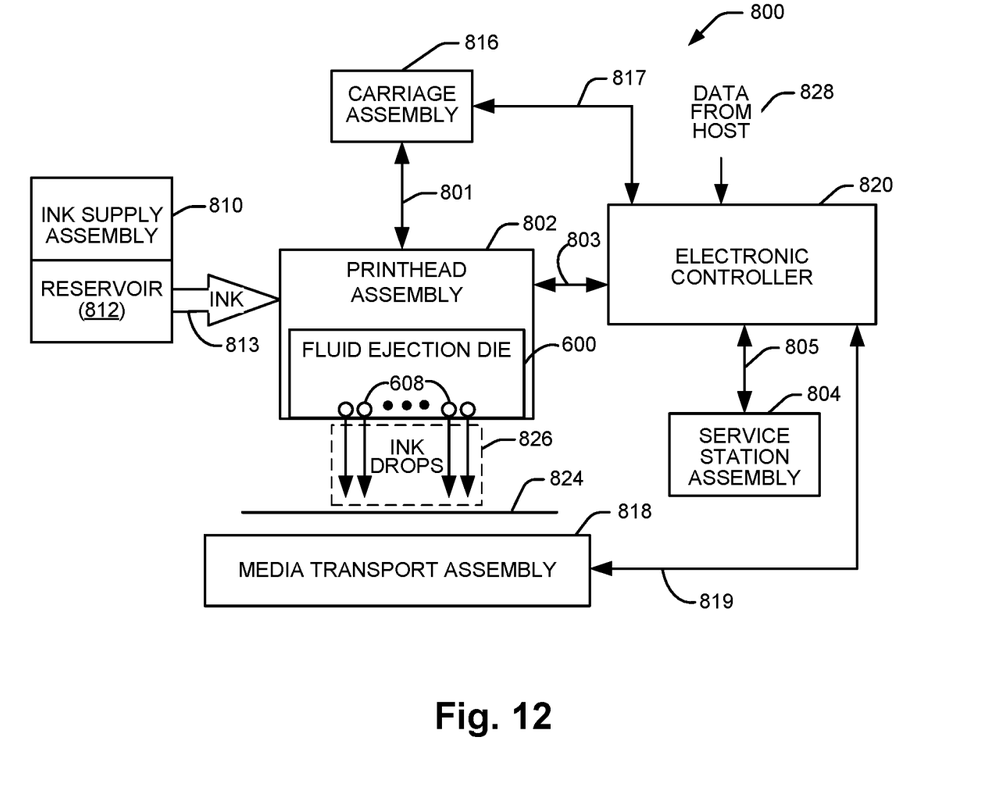
FIG. 12 is a block diagram illustrating one example of a fluid ejection system.

FIG. 12 is a block diagram illustrating one example of a fluid ejection system 800. Fluid ejection system 800 includes a fluid ejection assembly, such as printhead assembly 802, and a fluid supply assembly, such as ink supply assembly 810. In the illustrated example, fluid ejection system 800 also includes a service station assembly 804, a carriage assembly 816, a print media transport assembly 818, and an electronic controller 820. While the following description provides examples of systems and assemblies for fluid handling with regard to ink, the disclosed systems and assemblies are also applicable to the handling of fluids other than ink.

Printhead assembly 802 includes at least one printhead or fluid ejection die 600 previously described and illustrated with reference to FIGS. 10A and 10B, which ejects drops of ink or fluid through a plurality of orifices or nozzles 608. In one example, the drops are directed toward a medium, such as print media 824, so as to print onto print media 824. In one example, print media 824 includes any type of suitable sheet material, such as paper, card stock, transparencies, Mylar, fabric, and the like. In another example, print media 824 includes media for three-dimensional (3D) printing, such as a powder bed, or media for bioprinting and/or drug discovery testing, such as a reservoir or container. In one example, nozzles 608 are arranged in at least one column or array such that properly sequenced ejection of ink from nozzles 608 causes characters, symbols, and/or other graphics or images to be printed upon print media 824 as printhead assembly 802 and print media 824 are moved relative to each other.

Ink supply assembly 810 supplies ink to printhead assembly 802 and includes a reservoir 812 for storing ink. As such, in one example, ink flows from reservoir 812 to printhead assembly 802. In one example, printhead assembly 802 and ink supply assembly 810 are housed together in an inkjet or fluid-jet print cartridge or pen. In another example, ink supply assembly 810 is separate from printhead assembly 802 and supplies ink to printhead assembly 802 through an interface connection 813, such as a supply tube and/or valve.

Carriage assembly 816 positions printhead assembly 802 relative to print media transport assembly 818, and print media transport assembly 818 positions print media 824 relative to printhead assembly 802. Thus, a print zone 826 is defined adjacent to nozzles 608 in an area between printhead assembly 802 and print media 824. In one example, printhead assembly 802 is a scanning type printhead assembly such that carriage assembly 816 moves printhead assembly 802 relative to print media transport assembly 818. In another example, printhead assembly 802 is a non-scanning type printhead assembly such that carriage assembly 816 fixes printhead assembly 802 at a prescribed position relative to print media transport assembly 818.

Service station assembly 804 provides for spitting, wiping, capping, and/or priming of printhead assembly 802 to maintain the functionality of printhead assembly 802 and, more specifically, nozzles 608. For example, service station assembly 804 may include a rubber blade or wiper which is periodically passed over printhead assembly 802 to wipe and clean nozzles 608 of excess ink. In addition, service station assembly 804 may include a cap that covers printhead assembly 802 to protect nozzles 608 from drying out during periods of non-use. In addition, service station assembly 804 may include a spittoon into which printhead assembly 802 ejects ink during spits to ensure that reservoir 812 maintains an appropriate level of pressure and fluidity, and to ensure that nozzles 608 do not clog or weep. Functions of service station assembly 804 may include relative motion between service station assembly 804 and printhead assembly 802.

Electronic controller 820 communicates with printhead assembly 802 through a communication path 803, service station assembly 804 through a communication path 805, carriage assembly 816 through a communication path 817, and print media transport assembly 818 through a communication path 819. In one example, when printhead assembly 802 is mounted in carriage assembly 816, electronic controller 820 and printhead assembly 802 may communicate via carriage assembly 816 through a communication path 801. Electronic controller 820 may also communicate with ink supply assembly 810 such that, in one implementation, a new (or used) ink supply may be detected.

Electronic controller 820 receives data 828 from a host system, such as a computer, and may include memory for temporarily storing data 828. Data 828 may be sent to fluid ejection system 800 along an electronic, infrared, optical or other information transfer path. Data 828 represent, for example, a document and/or file to be printed. As such, data 828 form a print job for fluid ejection system 800 and includes at least one print job command and/or command parameter.

In one example, electronic controller 820 provides control of printhead assembly 802 including timing control for ejection of ink drops from nozzles 608. As such, electronic controller 820 defines a pattern of ejected ink drops which form characters, symbols, and/or other graphics or images on print media 824. Timing control and, therefore, the pattern of ejected ink drops, is determined by the print job commands and/or command parameters. In one example, logic and drive circuitry forming a portion of electronic controller 820 is located on printhead assembly 802. In another example, logic and drive circuitry forming a portion of electronic controller 820 is located off printhead assembly 802.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. An integrated circuit to drive a plurality of fluid actuation devices, the integrated circuit comprising:
    an external contact pad; and
    a programmable pulldown device electrically coupled to the external contact pad, the programmable pulldown device comprising an enable signal path, and the programmable pulldown device settable to any one of a plurality of resistances,
    wherein the programmable pulldown device is enabled or disabled in response to an enable signal on the enable signal path.

2. The integrated circuit of claim 1, wherein the programmable pulldown device comprises a transistor to enable the programmable pulldown device in response to the enable signal.

3. The integrated circuit of claim 1, wherein the programmable pulldown device comprises a voltage bias generator to provide a bias voltage in response to a bias magnitude, the bias voltage to set the programmable pulldown device to one of the plurality of resistances.

4. The integrated circuit of claim 1, wherein the programmable pulldown device comprises a first transistor settable to provide one of the plurality of resistances in response to a bias voltage and a second transistor to enable the programmable pulldown device in response to the enable signal.

5. The integrated circuit of claim 1, wherein the integrated circuit is a fluid ejection die.

6. An integrated circuit to drive a plurality of fluid actuation devices, the integrated circuit comprising:
    a first contact pad;
    a programmable pulldown device electrically coupled to the first contact pad; and
    a configuration register,
    wherein a resistance of the programmable pulldown device is set based on data stored in the configuration register.

7. The integrated circuit of claim 6, wherein the programmable pulldown device is enabled based on data stored in the configuration register.

8. The integrated circuit of claim 6, further comprising:
    a plurality of contact pads comprising the first contact pad, a second contact pad, and a third contact pad; and
    control logic to enable the programmable pulldown device in response to both a logic low signal on the second contact pad and a logic low signal on the third contact pad.

9. The integrated circuit of claim 6, wherein the programmable pulldown device comprises a first transistor to produce a resistance based on a bias voltage and a second transistor electrically coupled to the first transistor to enable the programmable pulldown device in response to an enable signal.

10. The integrated circuit of claim 9, wherein the programmable pulldown device comprises a voltage bias generator to provide the bias voltage to a gate of the first transistor in response to a bias magnitude stored in the configuration register.

11. The integrated circuit of claim 10, wherein the bias magnitude comprises a multi-bit value.

12. The integrated circuit of claim 9, wherein the first transistor is to produce a resistance between 30 kOhms and 300 kOhms.

13. The integrated circuit of claim 6, further comprising:
    an electrostatic discharge circuit coupled to the first contact pad.

14. An integrated circuit to drive a plurality of fluid actuation devices, the integrated circuit comprising:
    a contact pad;
    a programmable pulldown device electrically coupled to the contact pad; and
    a static pulldown device electrically coupled to the contact pad, the static pulldown device comprising an enable signal path,
    wherein the static pulldown device is enabled or disabled in response to an enable signal on the enable signal path.

15. The integrated circuit of claim 14, further comprising:
    a configuration register,
    wherein a resistance of the programmable pulldown device is set based on data stored in the configuration register.

16. An integrated circuit to drive a plurality of fluid actuation devices, the integrated circuit comprising:
    a contact pad;
    a programmable pulldown device electrically coupled to the contact pad;
    a static pulldown device electrically coupled to the contact pad; and
    a configuration register,
    wherein a resistance of the programmable pulldown device is set based on data stored in the configuration register, and
    wherein the programmable pulldown device comprises a first transistor to produce a resistance based on a bias voltage, a second transistor electrically coupled to the first transistor to enable the programmable pulldown device in response to an enable bit stored in the configuration register, and a voltage bias generator to provide the bias voltage to a gate of the first transistor in response to a bias magnitude stored in the configuration register.

* * * * *